(12) United States Patent
Nguyen

(10) Patent No.: US 7,064,602 B2
(45) Date of Patent: Jun. 20, 2006

(54) DYNAMIC GAIN COMPENSATION AND CALIBRATION

(75) Inventor: Huy Nguyen, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/840,724

(22) Filed: May 5, 2004

(65) Prior Publication Data
US 2005/0248389 A1    Nov. 10, 2005

(51) Int. Cl.
    *G05F 1/10*    (2006.01)
(52) U.S. Cl. .................. 327/541; 327/540; 323/316
(58) Field of Classification Search ............... 327/538, 327/540, 541, 543; 323/313, 315
    See application file for complete search history.

(56) References Cited

U.S. PATENT DOCUMENTS

| | | | | |
|---|---|---|---|---|
| 4,554,511 A | | 11/1985 | Braun | |
| 4,704,584 A | | 11/1987 | Smither | |
| 4,763,021 A | * | 8/1988 | Stickel | 326/71 |
| 4,883,987 A | | 11/1989 | Fattaruso | |
| 4,912,347 A | * | 3/1990 | Morris | 326/66 |
| 4,930,112 A | * | 5/1990 | Tanaka et al. | 327/545 |
| 5,124,632 A | * | 6/1992 | Greaves | 323/316 |
| 5,349,559 A | * | 9/1994 | Park et al. | 365/201 |
| 5,495,184 A | * | 2/1996 | Des Rosiers et al. | 327/541 |
| 5,629,611 A | * | 5/1997 | McIntyre | 323/313 |
| 5,821,808 A | * | 10/1998 | Fujima | 327/541 |
| 5,929,621 A | * | 7/1999 | Angelici et al. | 323/313 |
| 5,933,051 A | * | 8/1999 | Tsuchida et al. | 327/543 |
| 6,014,042 A | * | 1/2000 | Nguyen | 327/3 |
| 6,087,820 A | * | 7/2000 | Houghton et al. | 327/541 |
| 6,097,180 A | * | 8/2000 | Tsukude et al. | 327/541 |
| 6,201,374 B1 | * | 3/2001 | Ater et al. | 327/541 |
| 6,326,855 B1 | | 12/2001 | Jelinek et al. | 331/57 |
| 6,417,736 B1 | | 7/2002 | Lewyn | 330/297 |
| 6,563,371 B1 | * | 5/2003 | Buckley et al. | 327/539 |
| 6,570,436 B1 | * | 5/2003 | Kronmueller et al. | 327/538 |
| 2003/0222634 A1 | | 12/2003 | Santin et al. | |
| 2004/0080363 A1 | | 4/2004 | Yabe | |

OTHER PUBLICATIONS

Tewksbury, S.K. "Application-Specific Integrated Circuits (ASICS)." Microelectronic Systems Research Center, Dept. of Electrical and Computer Engineering, West Virginia University. May 15, 1996. pp. 1-18.

Smith, Michael John Sebastian "Application-Specific Integrated Circuits." VLSI Systems Series. Copyright © 1997 by Addison Wesley Longman, Inc. 3rd printing, Jan. 1998. pp. 864-881.

* cited by examiner

*Primary Examiner*—Terry D. Cunningham
(74) *Attorney, Agent, or Firm*—Silicon Edge Law Group; Arthur J. Behiel

(57) ABSTRACT

Described are methods and circuits that reduce or eliminate the impact of power-supply fluctuations on circuit performance. IC dies include compensation circuitry that compares local power-supply voltages to relatively stable reference voltages, such as unloaded distributed supply voltages, to sense local supply-voltage fluctuations. Based upon this comparison, the compensation circuitry adjusts circuit characteristics that might otherwise suffer performance degradation. Receivers in accordance with some embodiments automatically tailoring their gain to the output characteristics of a number of possible transmitter types with which the receivers may be expected to communicate.

11 Claims, 6 Drawing Sheets

DYNAMIC GAIN COMPENSATION AND CALIBRATION

FIELD OF THE INVENTION

The present invention relates generally to the field of communications, and more particularly to high-speed electronic signaling within and between integrated circuits.

BACKGROUND

FIG. 1 (prior art) depicts a plan view of an integrated circuit (IC) 100 illustrating a common power distribution scheme. IC 100 includes a number of blocks 105–109 adapted to perform various functions. Typical among myriad block types are transmitters, receivers, memory, and programmable logic. Blocks 105–109 communicate with one another via interconnect routing (not shown), and with external circuits via a number of input/output pads 110. Pads 110 provide physical connections to the external circuits and include circuitry that interfaces between the functional blocks and the external circuits and that protects IC 100 from electrostatic discharge.

Special power pads VDD and VSS deliver like-named supply voltages to a pair of power rings 115 and 120. (As with other designations herein, VDD and VSS refer to both signals and their corresponding nodes; whether a given designation refers to a signal or a node will be clear from the context.) Power branches 125 and 130 extend from respective power rings 115 and 120 to distribute power to blocks 105–109. Though not shown, a second power distribution network conveys power to the circuitry associated with pads 110. Power distributed to pads 110 is sometimes referred to as "dirty power" because the input and output circuitry draw relatively large amounts of supply current and thus introduce transient supply noise. ICs typically keep this dirty power separate from rings 115 and 120 to avoid injecting noise into blocks 105–109.

Power rings 115 and 120 and associated braches 125 and 130 exhibit impedance, so the respective local supply voltages Vdd and Vss at e.g. block 109 are somewhat lower than supply voltages VDD and VSS. The reduction in supply voltage is proportional to current and conductor length, so power-hungry circuits or circuits disposed in the center of an IC typically suffer greater supply-voltage degradation.

Many circuit parameters vary with supply voltage, so the reduced supply voltages Vdd and Vss impact circuit performance. For example, amplifier gain and the switching speeds of digital circuits drop with reductions in supply voltage. ICs can be designed to take these factors into account, for example by providing more metal lines and layers to deliver adequate power. These approaches are expensive, however, as the inclusion of additional metal increases complexity.

On-chip power distribution has long been an important issue in IC design. The problem is growing ever more severe with the improvements in device integration that flow from reduced feature sizes. One problem is that the resistance imposed by conductors increases with reductions in cross-sectional area, so smaller supply lines tend to drop more voltage. Another problem is that high performance circuits made with very small features require relatively low supply voltages, while the physical properties that dictate the operation of active devices place a lower limit on practical supply voltage levels. As supply voltages approach these low levels there is little "head room" left to allow for local supply-voltage reductions. These problems are particularly stubborn in high-speed systems because increasing switching speed increases the supply current, and increased supply current tends to reduce local supply voltages.

Delay variations that result from supply-voltage fluctuations are particularly problematic in systems in which the current drawn by neighboring blocks is subject to change. Referring to FIG. 1, for example, voltage levels Vdd and Vss to block 109 will vary depending upon the extent to which the remaining blocks 105–108 are drawing power, and are consequently loading power rings 115 and 120. The delays imposed by e.g. clock buffers within block 109 are thus subject to change with the activity in the remaining blocks. Such timing variations force IC designers to build in "guard bands" that account for worst-case timing variations; unfortunately, the inclusion of such guard bands limits device performance. There is therefore a need for methods and circuits that reduce or eliminate the impact of power-supply fluctuations on circuit performance.

Another problem that exists in the art relates to systems in which receivers are expected to receive data transmitted by one or more transmitters with disparate output characteristics. A receiver may be expected to receive data modulated using any one of a number of peak-to-peak voltage levels, for example. In such circumstances, the receivers may have insufficient gain for relatively low amplitude signals, or may exhibit more gain than is required for the higher amplitude signal. Insufficient gain can introduce receive errors, while excessive gain wastes power. There is therefore a need for calibration methods and circuits that optimize receivers based upon the characteristics of received signals.

SUMMARY

The following disclosure addresses the need for methods and circuits that reduce or eliminate the impact of power-supply fluctuations on circuit performance. Integrated-circuits in accordance with some embodiments include compensation circuitry that compares local power-supply voltages to relatively stable reference voltages to sense local supply fluctuations. Based upon this comparison, the compensation circuitry adjusts circuit characteristics that might otherwise suffer performance degradation. In one embodiment, for example, compensation circuitry boosts the drive current to one or more amplifiers in response to reductions in supply voltage. Increasing the drive current tends to improve gain, whereas reducing the supply voltage tends to reduce gain. The compensation circuit is adapted to increase gain by the amount required to offset the gain reduction resulting from the reduced local supply voltage.

The following disclosure also addresses the need for receivers capable of automatically tailoring their gain to the output characteristics of a number of possible transmitter types with which the receivers may be expected to communicate. Receivers in accordance with some embodiments automatically calibrate their gain for each of one or more transceivers.

This summary is in no way intended to limit the invention, which is instead defined by the allowed claims.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
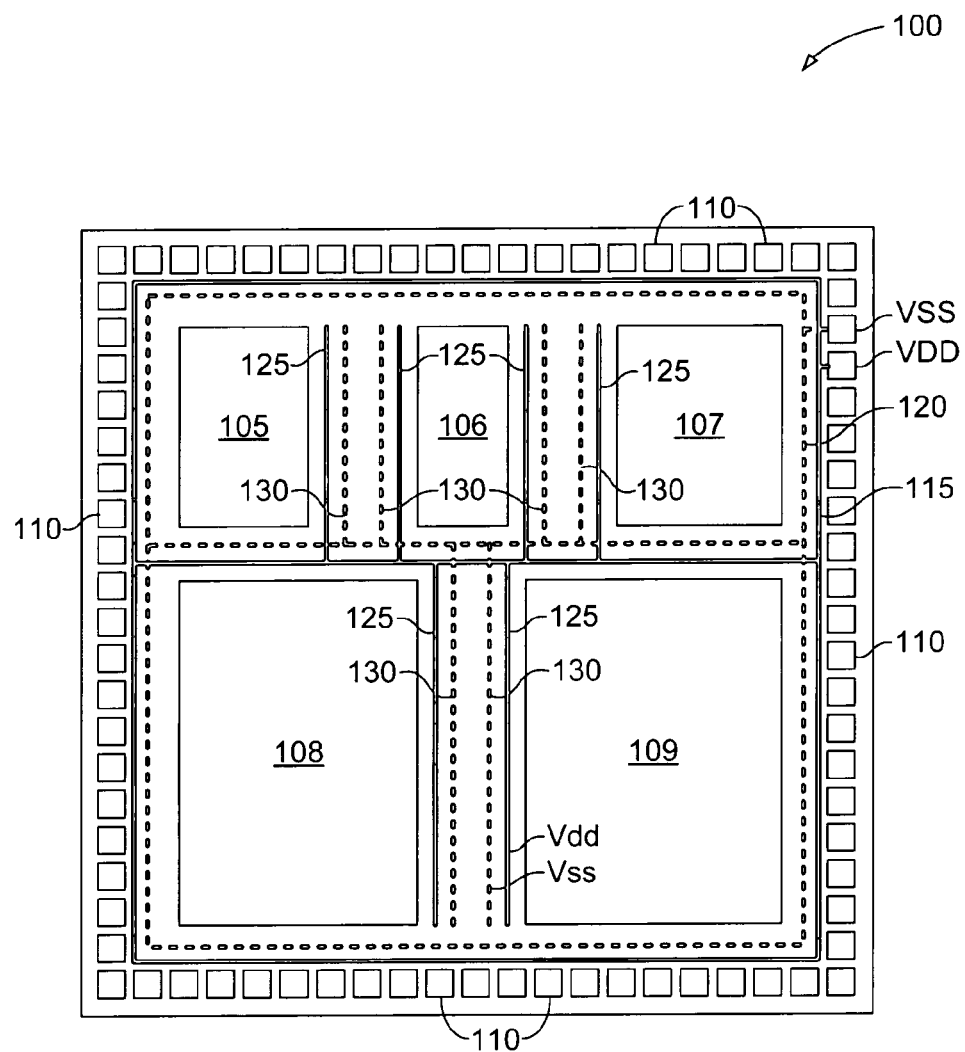
FIG. 1 (prior art) depicts a plan view of an integrated circuit (IC) 100 illustrating a common power distribution scheme. IC 100 includes a number of blocks 105–109 adapted to perform various functions.
Figure 2:
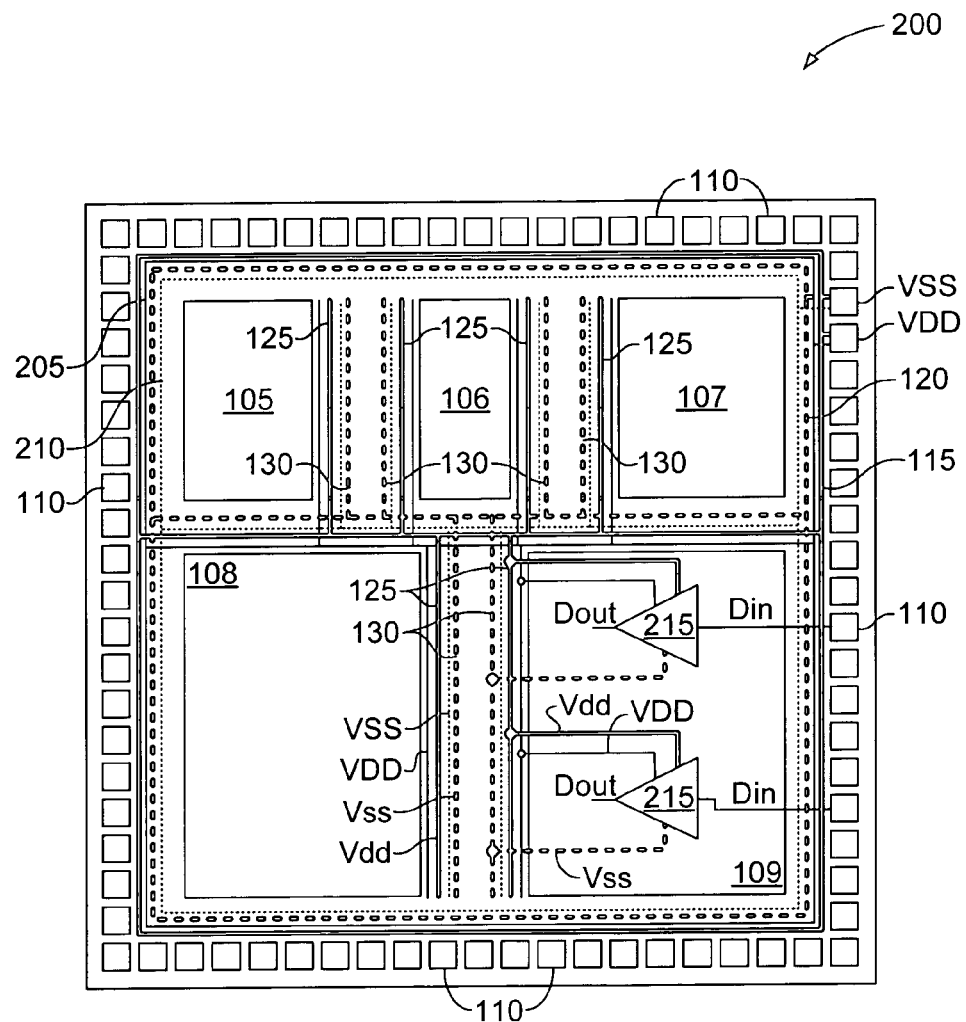
FIG. 2 depicts an integrated circuit (IC) 200 that exhibits stable speed performance in the face of local supply-voltage fluctuations.

FIG. 2 depicts an integrated circuit (IC) 200 that exhibits stable speed performance in the face of local supply-voltage fluctuations. IC 200 is similar to IC 100 of FIG. 1, like-identified elements being the same or similar. Unlike IC 100, however, IC 200 includes a pair of additional power-supply rings 205 and 210 and associated branches that distribute unloaded reference supply voltages VDD and VSS to circuits within blocks 105–109 that might be adversely affected by local supply-voltage fluctuations. In the example, block 109 includes at least one amplifier 215, the gain of which is assumed to be critical to system performance. One of amplifiers 215 might be, for example, a receiver for a high-speed serial communication link.

The gain of amplifier 215 depends upon local supply voltage Vdd, which varies with the load on power-supply ring 115. Changes in the amount of power drawn by other circuits within block 109 or blocks 105–108 can thus alter the gain of amplifier 205. In contrast to supply ring 115 and related branches 125, reference supply ring 205 and related branches are minimally loaded, and so distribute the full power-supply voltage VDD across IC 200, including to a supply-voltage reference terminal on amplifier 215. Amplifier 215 measures the difference between local supply voltage Vdd and the distributed, unloaded supply voltage VDD to sense reductions in local supply voltage Vdd. Amplifier 215 adjusts its gain as needed to counteract the effects of reductions in local supply voltage Vdd. Other embodiments similarly account for differences between loaded supply voltage Vss and full supply voltage VSS, but these are omitted here for brevity. Reference supply-voltage ring 210 may be omitted in systems that do not compensate for Vss fluctuations.

Figure 3:
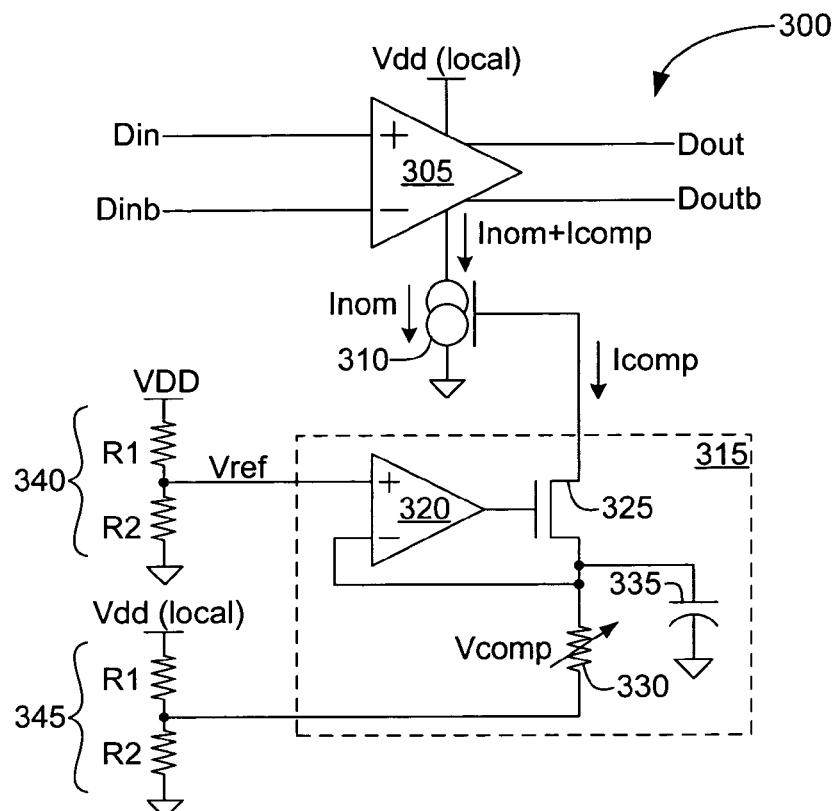
FIG. 3 depicts a gain-compensated amplifier 300 in accordance with one embodiment.

FIG. 3 depicts a gain-compensated amplifier 300 in accordance with one embodiment. Amplifier 300 might be used, for example, as amplifier 215 of FIG. 2. Amplifier 300 includes a conventional differential amplifier 305 connected to local supply terminal Vdd and, via an adjustable current source 310, to ground potential (e.g. Vss). A gain-compensation circuit 315 compares local supply voltage Vdd with the unloaded supply voltage VDD to produce a gain-compensation current Icomp for current source 310. The gain of amplifier 305 is proportional to the current through current source 310, so adjusting the compensation current Icomp through a current-control node alters the gain of amplifier 305. As detailed below, compensation circuit 315 adds compensation current Icomp to the nominal current Inom of amplifier 305, adjusting the compensation current as necessary to maintain the gain of amplifier 305 relatively constant despite local supply-voltage fluctuations. The amplitude of output signal Dout/Doutb from amplifier 305 is therefore a relatively constant multiple of the amplitude of input signal Din/Dinb.

Gain compensation circuit 315 includes a differential amplifier 320 that controls compensation current Icomp through a transistor 325 as needed to maintain equivalence between the inverting and non-inverting terminals of amplifier 320. The non-inverting input to amplifier 320 receives a fraction of supply voltage VDD, the fraction determined by the ratio of resistances R1 and R2 in a voltage divider 340. Due to the feedback provided by transistor 325, the inverting input to amplifier 320 is held to the same fraction of VDD. A filter capacitor 335 connects between the inverting input of amplifier 320 and ground potential.

Amplifier 320 maintains the voltage equivalence of its two input terminals by adjusting compensation current Icomp, and thus the voltage Vcomp dropped across a compensation resistor 330. The side of resistor 330 opposite transistor 325 is held at a fraction of local supply voltage Vdd by a second resistor network 345. The resistance values R1 and R2 are the same for both networks 340 and 345, so voltage Vcomp is proportional to the voltage difference between supply voltages VDD and Vdd. Stated mathematically:

$$Vcomp = (VDD - Vdd)\left[\frac{R1}{(R1+R2)}\right] \qquad (1)$$

Vcomp is the product of compensation current Icomp and the resistance Rcomp of resistor 330, so:

$$Icomp = (VDD - Vdd)\left[\frac{R1}{(R1+R2)Rcomp}\right] \qquad (2)$$

Compensation current Icomp is thus proportional to the disparity between reference supply voltage VDD and local supply voltage Vdd. Resistance Rcomp is adjustable in this embodiment to facilitate calibration of the relationship of equation 2.

Current source 310 adds compensation current Icomp to nominal current Inom. Because the gain of amplifier 305 is proportional to both drive current and local supply voltage Vdd, the increased compensation current that results from reductions in local supply voltage Vdd tend to cancel one another. Amplifier 300 thus provides a relatively stable gain over a range of local supply voltages Vdd. Ideally, any gain reduction resulting from loading of local supply voltage Vdd is identically offset by increased drive current.

Figure 4:
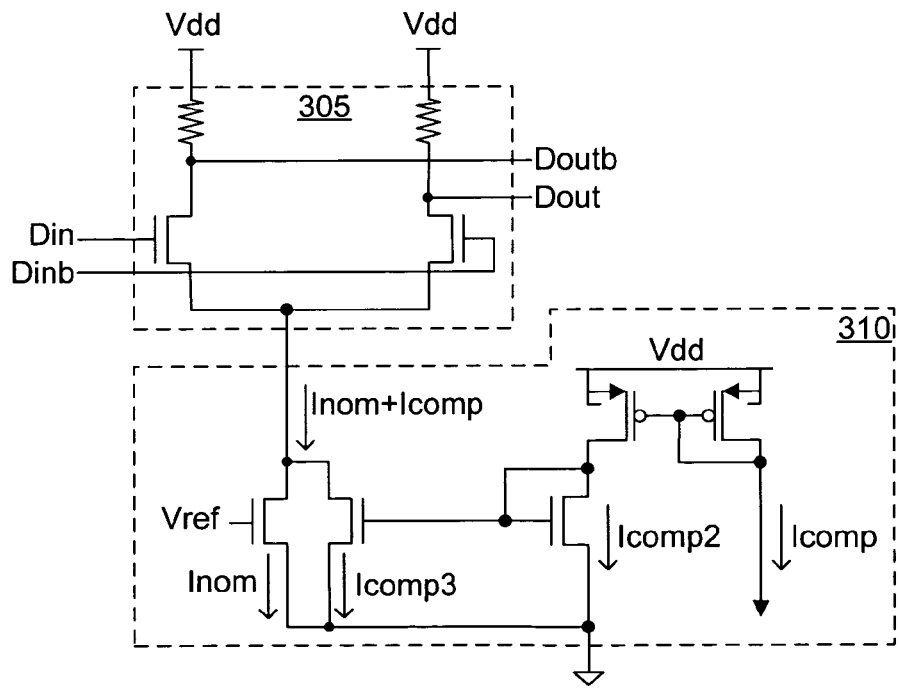
FIG. 4 details simple embodiments of amplifier 305 and current source 310.

FIG. 4 details simple embodiments of amplifier 305 and current source 310. A system of current mirrors duplicates current Icomp to create currents Icomp2 and Icomp3. Currents Icomp, Icomp2, and Icomp3 are equal in this embodiment, but the depicted transistors can be sized to alter the relationships between these currents. These and other modification will be obvious to those of skill in the art.

Figure 5:
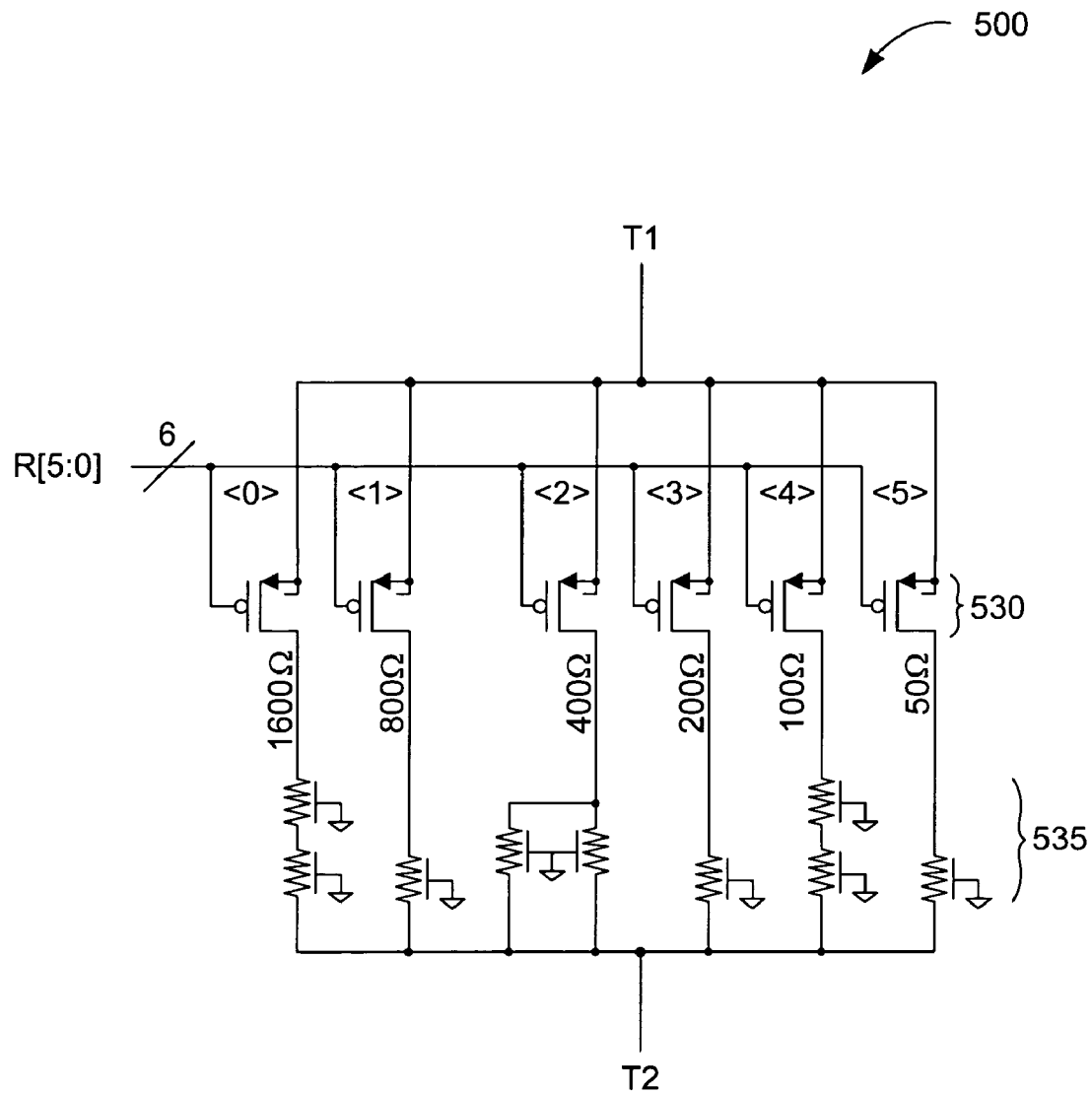
FIG. 5 depicts a variable resistor 500 that is used as variable resistor 330 in one embodiment.

FIG. 5 depicts a variable resistor 500 that is used as variable resistor 330 in one embodiment. Resistor 500 includes a resistor network 535 and a collection of PMOS transistors 530, the gates of which are connected to the six lines of a control bus R[5:0]. Each PMOS transistor 530 controls the current through a respective resistive path.

These resistive paths provide binary-weighted resistances from about 50 to 1600 ohms, so termination element 500 can produce a wide range of resistances by enabling selected transistors 530. Resistor 500 allows for calibration because the weighted resistance values can vary with process, temperature, and voltage variations. Calibration can be provided using a simple register connected to control bus R[5:0] or by some other conventional means. The binary-weighted scheme of element 500 provides a relatively low-capacitance, area-efficient means of producing a large number of potential resistance values. Other embodiments use different types or elements to provide fixed or adjustable resistance values.

Figure 6:
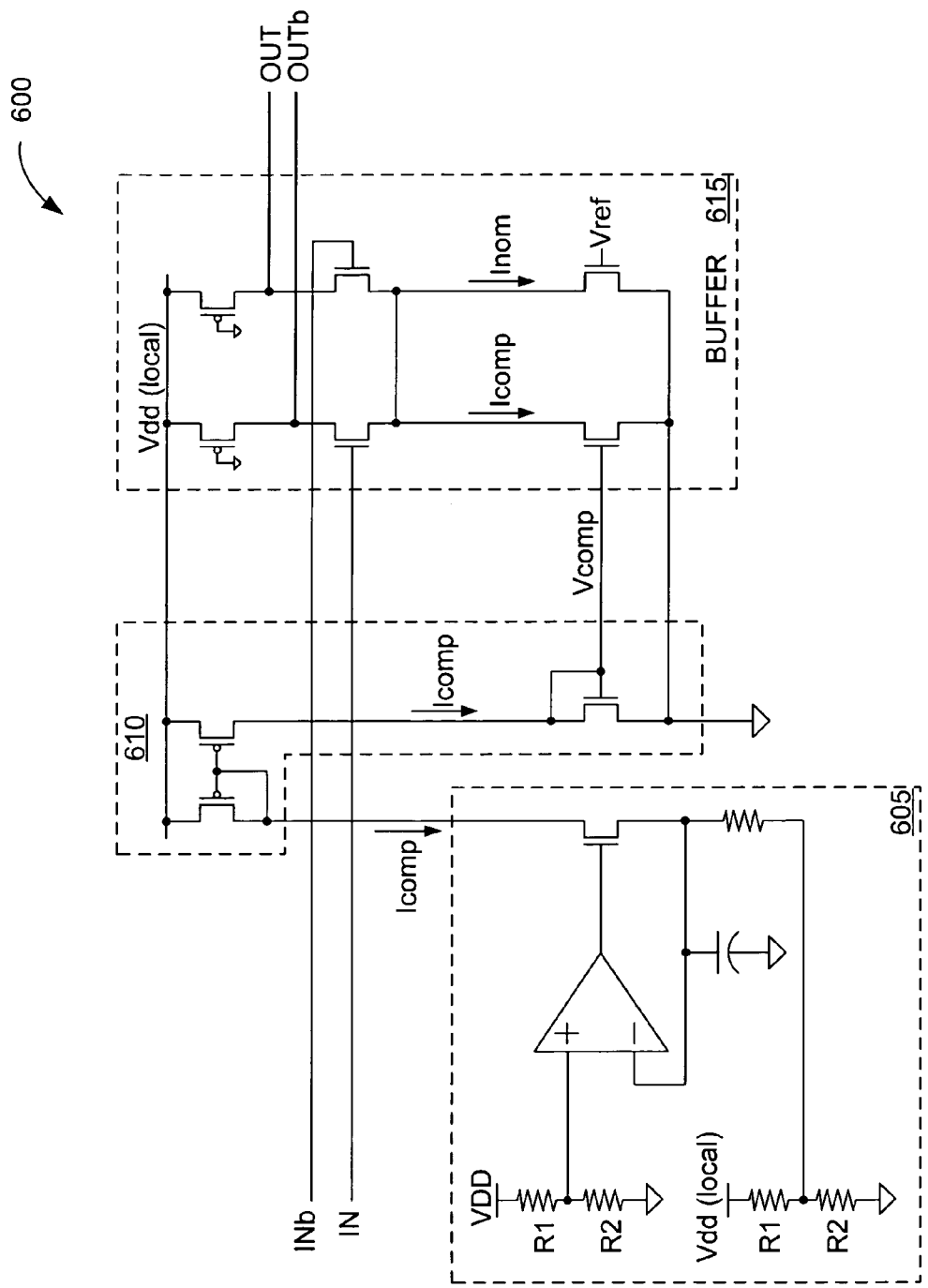
FIG. 6 depicts a buffer 600 adapted in accordance with another embodiment.

FIG. 6 depicts a buffer 600 adapted in accordance with another embodiment. The delays induced by various analog and digital circuit elements (e.g. amplifiers, level-shifters, buffers, gates, inverters, and storage elements) vary with supply voltage. Supply-voltage fluctuations can therefore introduce deleterious timing errors. Buffer 600 includes current-compensation circuitry that stabilizes signal-propagation delay by compensating for changes in local supply-voltage Vdd.

Buffer 600 includes three sub-circuits: a delay-compensation circuit 605 that develops a compensation current Icomp proportional to the difference between reference supply voltage VDD and local supply voltage Vdd, a current mirror 610 that duplicates compensation current Icomp to produce a compensation voltage Vcomp, and a differential buffer 615 that exhibits a signal-propagation delay between differential input nodes IN/INb and differential output nodes OUT/OUTb.

The signal-propagation delay through buffer 600 is inversely proportional to local supply voltage Vdd. Reductions in local supply voltage Vdd thus tend to increase signal-propagation delay. Compensation current Icomp is inversely proportional to local supply voltage Vdd, and is added to the nominal current Inom. The sum of the compensation current Icomp and nominal current Inom provide the drive current for differential buffer 615. Reductions in local supply voltage Vdd thus increase compensation current Icomp, and consequently increase the drive current of differential buffer 615. The increased drive current reduces the delay through buffer 615 to compensate for the delay increase due to the reduction in local supply voltage Vdd. Due to the inverse proportion of the drive current Inom+ Icomp with respect to the difference between VDD and Vdd, buffer 600 maintains a relatively stable delay over a range of local supply-voltage levels.

Compensation circuit 605, current mirror 610, and buffer 615 are similar to circuits detailed above in connection with FIG. 3: a detailed discussion of these circuits is therefore omitted for brevity.

Figure 7:
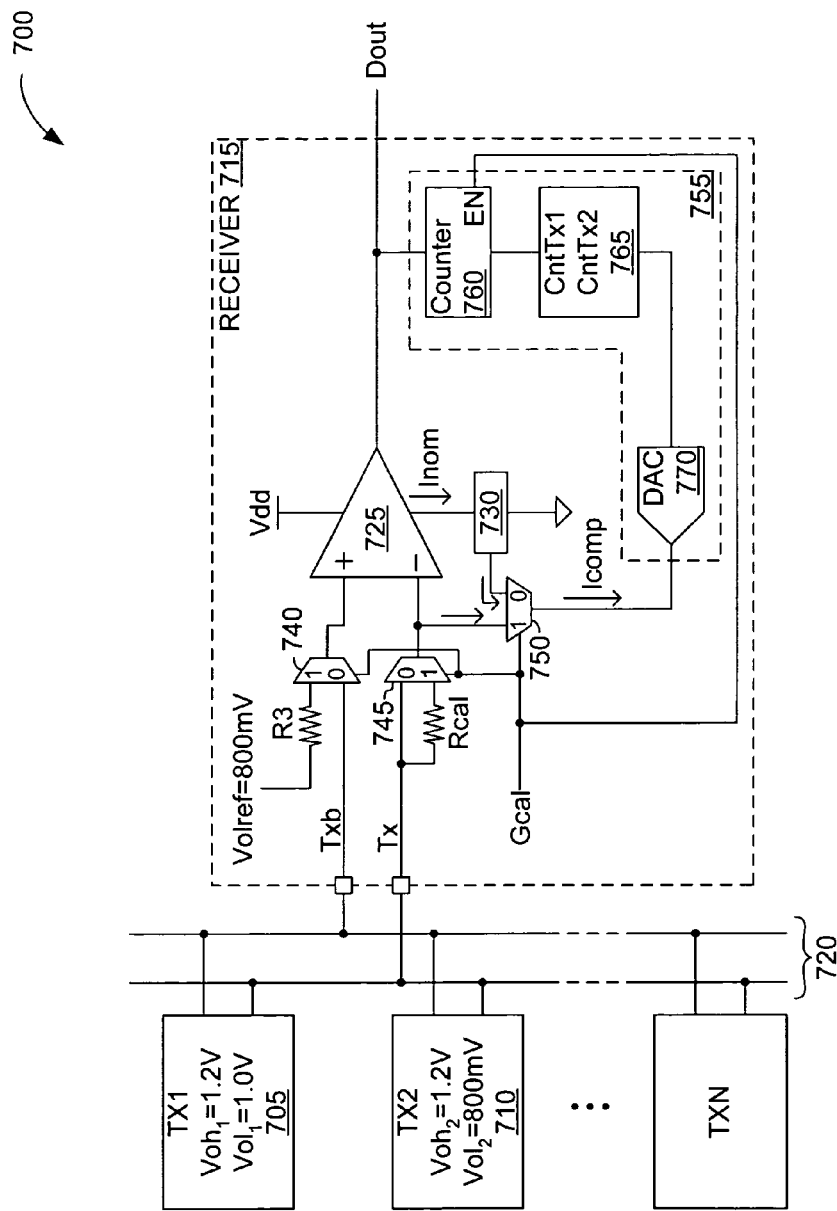
FIG. 7 depicts a communication system 700 that includes N transmitters TX[1–N], including a pair of transmitters 705 and 710, connected to a receiver 715 via a common bus 720.

FIG. 7 depicts a communication system 700 that includes N transmitters TX[1–N], including a pair of transmitters 705 and 710, connected to a receiver 715 via a common bus 720. Transmitters on a common bus may have different output characteristics. In the example, transmitter 705 presents digital signals as 200 mV peak-to-peak signals ranging between high output voltage $Voh_1$ of 1.2 volts and a low output voltage $Vol_1$ of 1.0 volts and transmitter 710 presents digital signals as 400 mV peak-to-peak signals ranging between a high output voltage $Voh_2$ of 1.2V and a low output voltage $Vol_2$ of 800 mV. In such circumstances, conventional receivers may have insufficient gain for the lower amplitude signal, or may exhibit more gain than is required for the higher amplitude signal. Insufficient gain can introduce receive errors, while excessive gain wastes power. Receiver 715 addresses this problem with a calibration scheme that optimizes receiver gain for each of one or more transmitters.

Receiver 715 includes conventional receive circuitry, a sampler 725 in this example. The gain of sampler 725 depends upon the local supply voltage Vdd and a nominal drive current Inom provided by a current source 730. As detailed below, a compensation current Icomp may be added to nominal current Inom to increase the gain of sampler 725. Compensation current Icomp, and thus the gain of sampler 725, can be altered as needed to tailor the gain of receiver 715 to the output characteristics of each transmitter on bus 720. The following discussion describes how receiver 715 can be calibrated for use with transmitters 705 and 710, but receiver 715 may be adapted to provide calibration for more or fewer transmitters.

Beginning with a calibration sequence for transmitter 705, some control circuitry (not shown) asserts a gain-calibration signal Gcal and instructs transmitter 705 to issue a stream of logic zeros. In response, transmitter 705 provides low-output voltage $Vol_1$ (1.0V) on line Tx and high-output voltage $Voh_1$ (1.2V) on line Txb. The assertion of signal Gcal causes a pair of multiplexers 740 and 745 to apply a reference output-low signal Volref of 800 mV to the non-inverting input of sampler 725 and the 1.0V output-low signal $Vol_1$ from transmitter 705 to the inverting input of sampler 725 via a calibration resistor Rcal. A second resistor R3 matching resistor Rcal is optionally included to balance any voltage drop on the two inputs of sampler 725 due to leakage current. Also in response to the assertion of gain-calibration signal Gcal, a demultiplexer 750 connects output node Dout of sampler 725 to the inverting input of sampler 725 via a feedback circuit 755. Feedback circuit 755 then responds to the output signal Dout by altering compensation current Icomp to equalize the signal levels on the input terminals of sampler 725. In this example, 800 mV is applied to the non-inverting input of sampler 725 while transmitter 705 applies an output-low value of 1.0V on terminal Tx. Feedback circuit 755 thus adjusts compensation current Icomp until calibration resistor Rcal drops 200 mV (i.e., Rcal*Icomp=200 mV), leaving the inverting input terminal of sampler 725 at 800 mV.

The control circuitry that issues calibration instructions to the various components of system 700 can be instantiated along with the depicted transmit or receive circuitry on the same device, or can be instantiated on another device. In an embodiment in which bus 720 is a memory bus, for example, the control circuitry can be part of a memory controller coupled to bus 720.

In the depicted embodiment, feedback circuit 755 includes a counter 760 that increments when signal Dout is representative of a logic one and decrements when signal Dout is representative of a logic zero. Feedback circuit 755 additionally includes a memory 765, which stores one or more counts provided by counter 760, and a digital-to-analog converter (DAC) 770 that converts digital values provided by memory 765 into analog values expressed as compensation current Icomp.

Asserting gain-calibration signal Gcal enables counter 760. Memory 765 stores the count in a register corresponding to the transmitter for which receiver 715 is being calibrated, transmitter 705 in this example, and also presents the count to DAC 770. Counter 760 then increments or decrements as necessary to establish the correct compensation current Icomp for transmitter 705. Memory 765 latches the final count from counter 760 when gain-calibration signal Gcal is deasserted and stores the count in a register corresponding to the transmitter for which receiver 715 is being calibrated, transmitter 705 is this example.

Gain-calibration signal Gcal is de-asserted once the two inputs to sampler 725 are at the same voltage, indicating a correct setting for compensation current Icomp. The value in counter 760 corresponding to the correct compensation current is then stored in memory 765 in a field CntTx1 correlated to transmitter 705. Thereafter, receiver 715 applies the contents of field CntTx1 to DAC 770 whenever receiver 715 is receiving information from transmitter 705. Also as a consequence of de-asserting signal Gcal, multiplexers 740 and 745 deliver differential signals Tx/Txb directly to respective input terminals of sampler 725 and demultiplexer 750 draws current Icomp from current source 730. Current source 730 thus adds the correct compensation current Icomp to nominal current Inom to increase the gain of sampler 725 to a level optimized for the output characteristics of transmitter 705.

The calibration sequence of transmitter 710 is similar to that of transmitter 705. Gain-calibration signal Gcal is once again asserted. This time, however, transmitter 710 is instructed to issue a stream of logic zeros. Transmitter 710 represents logic zeros as differential signals in which signal Txb is 1.2 volts and signal Tx is 800 mV. The resulting 400 mV peak-to-peak signal is higher in amplitude than the 200 mV signal from transmitter 705, so the gain of receiver 715 can be lower than for transmitter 705.

The assertion of signal Gcal causes multiplexers 740 and 745 to apply reference output-low signal Volref of 800 mV to the non-inverting input of sampler 725 and the 800 mV $Vol_2$ on line Tx to the inverting input of sampler 725 via calibration resistor Rcal. Because Volref equals $Vol_2$, calibration resistor Rcal should not drop any voltage to render equal the two inputs of sampler 725. Feedback circuit 755 thus leaves compensation current Icomp at zero and stores the associated count from counter 760 in field CntTx2 of memory 765.

Post calibration, memory 765 includes a digital value for each transmitter on bus 720. Receiver 715 then applies the requisite value to DAC 770 for whatever transmitter is conveying data to receiver 715 via bus 720. The gain of sampler 725 will thus be optimized for the output characteristics of each transmitter.

Transmitters 705 and 710 and the components of receiver 715 are well known to those of skill in the art, so a detailed discussion is omitted here for brevity. An embodiment of current source 730 is detailed in FIG. 4 as current source 310.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "active" or "activated" when a signal is asserted on the signal line, and "deactive" or "deactivated" when the signal is deasserted. Additionally, the prefix symbol "/" or suffix "b" attached to signal names indicates that the signal is an active low signal (i.e., the asserted state is a logic low state). A line over a signal name (e.g., '<signalname>') is also used to indicate an active-low signal. In any case, whether a given signal is an active low or an active high will be evident to those of skill in the art.

While the present invention has been described in connection with specific embodiments, variations of these embodiments will be obvious to those of ordinary skill in the art. For example:

a. Receiver 715 of FIG. 7 can be adapted to include the gain- and delay-compensation circuitry described in connection with FIGS. 2–6.

b. Reference voltage Vref to e.g. amplifier 320 of FIG. 3 need not be based upon a distributed supply voltage, but can be any suitable reference level. In some embodiments, for example, voltage Vref is derived locally using a conventional voltage reference (e.g., a zener diode or a bandgap voltage reference circuit).

c. Compensation circuits like circuit 315 of FIG. 3 can be shared among a number of circuit elements sharing a local supply node and thus subjected to the same supply fluctuations. Some embodiments duplicate compensation current Icomp for each of a plurality of similar amplifiers, or provide different compensation currents to different circuit elements, where each compensation current is a predetermined multiple of another.

d. A fraction of local supply voltage Vdd may be obtained using circuits other than the resistive voltage dividers employed herein.

Moreover, some components are shown directly connected to one another while others are shown connected via intermediate components. In each instance the method of interconnection, or "coupling," establishes some desired electrical communication between two or more circuit nodes (e.g., circuit terminals, lines, pads, ports). Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. Section 112.

What is claimed is:

1. An integrated circuit comprising:
  a. a power-supply pad adapted to receive a first power-supply voltage;

b. a power-supply branch extending from the pad;
c. an amplifier including:
   i. a local power-supply node connected to the power-supply pad via the power-supply branch; and
   ii. an adjustable current source drawing a supply current from the power-supply pad to the local power-supply node via the power-supply branch, wherein the local power-supply node exhibits a second power-supply voltage less than the first power-supply voltage; and
d. a gain compensation circuit having a first input terminal coupled to the local power-supply node, a second input terminal coupled to a reference node, and an output terminal coupled to the adjustable current source;
e. wherein the gain compensation circuit controls the supply current in response to changes in the second power-supply voltage; and
f. a reference branch, independent of the power-supply branch, coupled between the pad and the reference node.

2. The integrated circuit of claim 1, wherein the amplifier is one of a plurality of amplifiers distributed across the integrated circuit, and wherein the gain of each amplifier is substantially constant with changes in the difference between the second power-supply voltage and a reference voltage on the reference node.

3. The integrated circuit of claim 1, wherein the amplifier is one of a plurality of amplifiers distributed across the integrated circuit, and wherein at least one of the amplifiers is a buffer.

4. The integrated circuit of claim 1, wherein the amplifier is one of a plurality of amplifiers distributed across the integrated circuit, and, each amplifier further comprising a differential amplifier having a first differential amplifier terminal connected to the local power-supply node, a second differential amplifier terminal connected to a voltage-reference node, and a differential amplifier output terminal.

5. The integrated circuit of claim 4, each amplifier further comprising a variable current source through which flows the supply current, the variable current source including a current-control node.

6. The integrated circuit of claim 5, each amplifier further comprising a transistor having a control node connected to the differential amplifier output terminal, a first current-handling terminal connected to the current-control node, and a second current-handling terminal.

7. The integrated circuit of claim 6, each amplifier further comprising a variable resistor connected between the second current-handling terminal and the second power-supply pad.

8. The integrated circuit of claim 1, wherein the amplifier is one of a plurality of amplifiers distributed across the integrated circuit, and wherein each of the plurality of amplifiers is coupled to the power-supply pad via a respective second power-supply branch.

9. The integrated circuit of claim 1, wherein the gain compensation circuit compares a local power-supply voltage on the local power-supply node with a reference voltage on the reference node.

10. The integrated circuit of claim 9, wherein the reference voltage equals the first power-supply voltage.

11. The integrated circuit of claim 1, wherein the gain compensation circuit alters the supply current in proportion to a difference between a first power-supply voltage on the pad and a local power-supply voltage on the local power-supply node.

* * * * *